US009658246B2

(12) United States Patent
Konings et al.

(10) Patent No.: US 9,658,246 B2
(45) Date of Patent: May 23, 2017

(54) METHOD OF STUDYING A SAMPLE IN AN ETEM

(75) Inventors: Stan Johan Pieter Konings, Breda (NL); Stephan Kujawa, Veldhoven (NL); Petrus Hubertus Franciscus Trompenaars, Tilburg (NL)

(73) Assignee: FEI Company, Hillsboro, OR (US)

(*) Notice: Subject to any disclaimer, the term of this patent is extended or adjusted under 35 U.S.C. 154(b) by 1090 days.

(21) Appl. No.: 13/566,834

(22) Filed: Aug. 3, 2012

(65) Prior Publication Data

US 2013/0040400 A1 Feb. 14, 2013

Related U.S. Application Data

(60) Provisional application No. 61/514,648, filed on Aug. 3, 2011.

(30) Foreign Application Priority Data

Aug. 3, 2011 (EP) .................................... 11176445

(51) Int. Cl.
*G01N 23/04* (2006.01)
*G01Q 30/12* (2010.01)
(Continued)

(52) U.S. Cl.
CPC .............. *G01Q 30/12* (2013.01); *B82Y 35/00* (2013.01); *H01J 37/20* (2013.01); *H01J 37/26* (2013.01);
(Continued)

(58) Field of Classification Search
CPC ............. G01N 23/20033; G01N 30/88; G01N 2203/0226; G01N 23/2251;
(Continued)

(56) References Cited

U.S. PATENT DOCUMENTS

| | | | |
|---|---|---|---|
| 4,009,964 | A | 3/1977 | Bergen |
| 7,420,184 | B2 | 9/2008 | Van De Water et al. |

FOREIGN PATENT DOCUMENTS

| | | |
|---|---|---|
| CN | 1344952 | 4/2002 |
| CN | 1862250 | 11/2006 |

(Continued)

OTHER PUBLICATIONS

Petkov "In Situ Real-Time TEM Reveals Growth, Transformation and Function in One-Dimensional Nanoscale Materials: From a Nanotechnology Perspective", ISRN Nanotechnology, 2013, Article ID 893060, pp. 1-21.*

Zhang, Xiao Feng, et al., 'Imaging gas-solid interactions in an atomic resolution environmental TEM,' Microscopy Today, Sep. 2006,. pp. 16-18.

(Continued)

*Primary Examiner* — Yelena G Gakh
(74) *Attorney, Agent, or Firm* — Scheinberg & Associates, P.C.; Michael O. Scheinberg; John E. Hillert

(57) ABSTRACT

A method and apparatus is provided for studying the reaction (chemical or physical) of a sample with a gas in the active atmosphere of an instrument such as an Environmental Transmission Electron Microscope (ETEM), optical microscope, X-ray microscope or scanning probe microscope. The sample is exposed to inert gas at a desired temperature before exchanging the inert gas to the active gas to reduce to avoid, or at least minimize, sample drift during image acquisition.

13 Claims, 2 Drawing Sheets

(51) Int. Cl.
*H01J 37/20* (2006.01)
*H01J 37/26* (2006.01)
*B82Y 35/00* (2011.01)

(52) U.S. Cl.
CPC .................. *H01J 2237/2001* (2013.01); *H01J 2237/2002* (2013.01); *H01J 2237/2003* (2013.01); *H01J 2237/28* (2013.01)

(58) Field of Classification Search
CPC .... G01N 2021/6417; B01J 2219/00585; B01J 2219/00587; G01Q 30/12; H01J 37/20; H01J 37/26; H01J 2237/2002; H01J 2237/2003; H01J 2237/28; H01J 2237/2001; B82Y 35/00
USPC .......................................... 436/164; 422/68.1
See application file for complete search history.

(56) References Cited

FOREIGN PATENT DOCUMENTS

| | | |
|---|---|---|
| JP | H1194714 | 4/1999 |
| JP | 2001305028 | 10/2001 |
| JP | 3944545 | 7/2007 |
| WO | 2007511312 | 5/2007 |

OTHER PUBLICATIONS

H.J.M. Ter Brake et al., "Micromachined Joule-Thomson Coolers for Cooling Low-Temperature Detectors and Electronics", Proceedings of the 7th International Conference on Space Optics, Oct. 14, 2008, 4 pages.

* cited by examiner

METHOD OF STUDYING A SAMPLE IN AN ETEM

This application claims priority from U.S. Provisional Patent Application 61/514,648, filed Aug. 3, 2011, which is hereby incorporated by reference.

The invention relates to a method for studying a sample in an evacuable sample chamber, at least part of the study performed in an active atmosphere with a controlled pressure and temperature, as a result of which the sample shows a chemical reaction or physical change, the sample chamber equipped with a sample holder for holding the sample at a sample position, the sample holder equipped with means for controlling the temperature of the sample to a temperature different from the temperature of the sample chamber, part of the sample holder having the temperature of the sample chamber and part of the sample holder having the temperature of the sample, the thermal gradient over the sample holder influenced by gas pressure, gas temperature and gas flow, as a result of which the sample position is a function of gas pressure, gas temperature and gas flow, the study comprising the successive steps of:

Introducing the sample in the sample chamber,

Bringing the sample to a desired temperature,

Exposing the sample to the active atmosphere with a gas pressure and temperature, and Acquiring an image of the sample when the chemical reaction or physical change starts, the image showing an associated field of view, an associated acquisition time and an associated resolution.

Such a method is known from "Imaging gas-solid interactions in an atomic resolution environmental TEM", X. F. Zhang et al., Microscopy Today, September 2006, p 16-18.

In an Environmental Transmission Electron Microscope (ETEM), a sample can be studied at a pressure of, for example, between $10^{-2}$ mbar to 100 mbar, often in conjunction with the possibility to study the sample at the high-vacuum pressures ($<10^{-4}$ mbar, more typically $<10^{-7}$ mbar) used in conventional Transmission Electron Microscopes (TEM). By using a chemically reactive gas, reaction in, for example, catalysts, can be studied.

A major application of ETEM's is in studying wet samples, such as biological samples, without dehydrating them. These studies are preferably done at a temperature between 0° C. and 37° C., and normally no change in gas composition or temperature is necessary during the study.

Another major application of ETEM's is in the study of gas-solid interactions. Such studies include, but are not limited to, interactions between a gas and a catalysts, a gas and a matrix material, etc. These studies often involve the introduction of a gas to start a reaction between sample and gas, and observe the sample from the moment the reaction starts.

In the known publication, page 18, column 2, the drift off the sample resulting by the introduction of a gas is identified as a major concern in practical in-situ heating electron microscopy experiments. Zhang states that the changing temperature or temperature fluctuations caused by gas injection introduce thermal expansion or contraction of the support of the sample. Experiments learn that, when using for example a side entry sample heating holder, such as, for example, the commercially available Gatan 628 Single Tilt Heating Holder, manufactured by Gatan Inc., Pleasanton, Calif. 94588, USA, the change in temperature gradient over the sample holder when introducing a gas causes thermal expansion/contraction changes, and thus positional drift. It is noted that, as the resolution of a TEM can be as low as 0.1 nm or less, even small changes in the thermal gradient may introduce a drift during the acquisition of an image that results in a blurring of the image.

It is noted that the largest drift rate occurs at the moment that the sample is first exposed to the gas, coming from a high-vacuum condition. After a while the drift disappears. However, waiting is often not an option, as especially the onset of reactions are of the greatest interest. According to the known publication the drift can easily last for over an hour.

The article then proceeds to refer to a specialized sample holder in the form of a furnace. However, such a sample holder severely limits the analysis methods available.

There is a need for a method of studying a sample in an active atmosphere while drift is not a limiting factor in the resolution of the images acquired.

The invention intends to provide a solution to said problem.

To that end the method according to the invention is characterized in that, before exposing the sample to the active atmosphere, the sample is exposed to an inert atmosphere that does not show said chemical or physical activity to the sample, the inert atmosphere having a gas pressure, gas flow and gas temperature, and the gas temperature, gas flow and gas pressure of the inert atmosphere is controlled to a level where the thermal gradient over the sample holder when exposed to the inert atmosphere and when exposed to the active atmosphere are sufficiently close to each other that, during the acquisition time of the image, the drift of the sample position with respect to the field of view is less than ten times the resolution of said image, more specifically less than twice the resolution of said image, most specifically less than the resolution of said image.

The invention is based on the insight that, in the prior art, a sample is first exposed to a high vacuum of, for example, $10^{-4}$ mbar. This results in a first thermal equilibrium of the sample holder. Introducing the chemically active gas causes the temperature gradient over the sample holder to change to a second thermal equilibrium. The inventors realized that, by first exposing the sample holder to an inert gas causing an identical, or almost identical, thermal equilibrium over the holder, the drift becomes smaller. When first an inert gas with similar thermal capacity, temperature and flow is admitted, and then exchanged with the chemically active gas, the drift during change-over (at the moment the reaction starts) can be kept sufficiently small to obtain images in which the blurring due to drift is negligible, or almost negligible.

This method can be used with any instrument that inspects a sample in an evacuable sample chamber, and includes charged particle apparatuses, such as a Scanning Transmission Electron Microscope (STEM), Transmission Electron Microscope (TEM), Scanning Electron Microscope (SEM), Focused Ion Beam apparatus (FIB), or any apparatus equipped with a STEM, TEM, SEM and/or FIB column, photonic apparatuses, such as optical and X-ray apparatuses, and Scanning Probe Microscopes (SPM), such as Scanning Tunneling Microscopes (STM) and the like.

The method is especially suited for instruments where the sample is heated to a temperature of more than 100° C., more specifically more than 500° C., most specifically more than 1000° C., or cooled to a temperature of lower than −20° C., more specifically lower than −137° C., resulting in a large temperature gradient over the sample holder.

In a preferred embodiment the method is used in conjunction with a side entry sample holder for a transmission electron microscope or a scanning transmission electron microscope, as this asymmetric design is prone to drift.

Preferably the drift of the side entry sample holder in a STEM or TEM is, with respect to the field of view, less than 1 nm/s, more specifically less than 0.2 nm/s, most specifically less than 0.1 nm/s.

BRIEF DESCRIPTION OF THE DRAWINGS

The invention is now elucidated using figures, in which identical reference numerals refer to corresponding features. To that end:

FIG. 1 schematically shows a Environmental Transmission Electron Microscope (ETEM) according to the invention.

Figure 1:
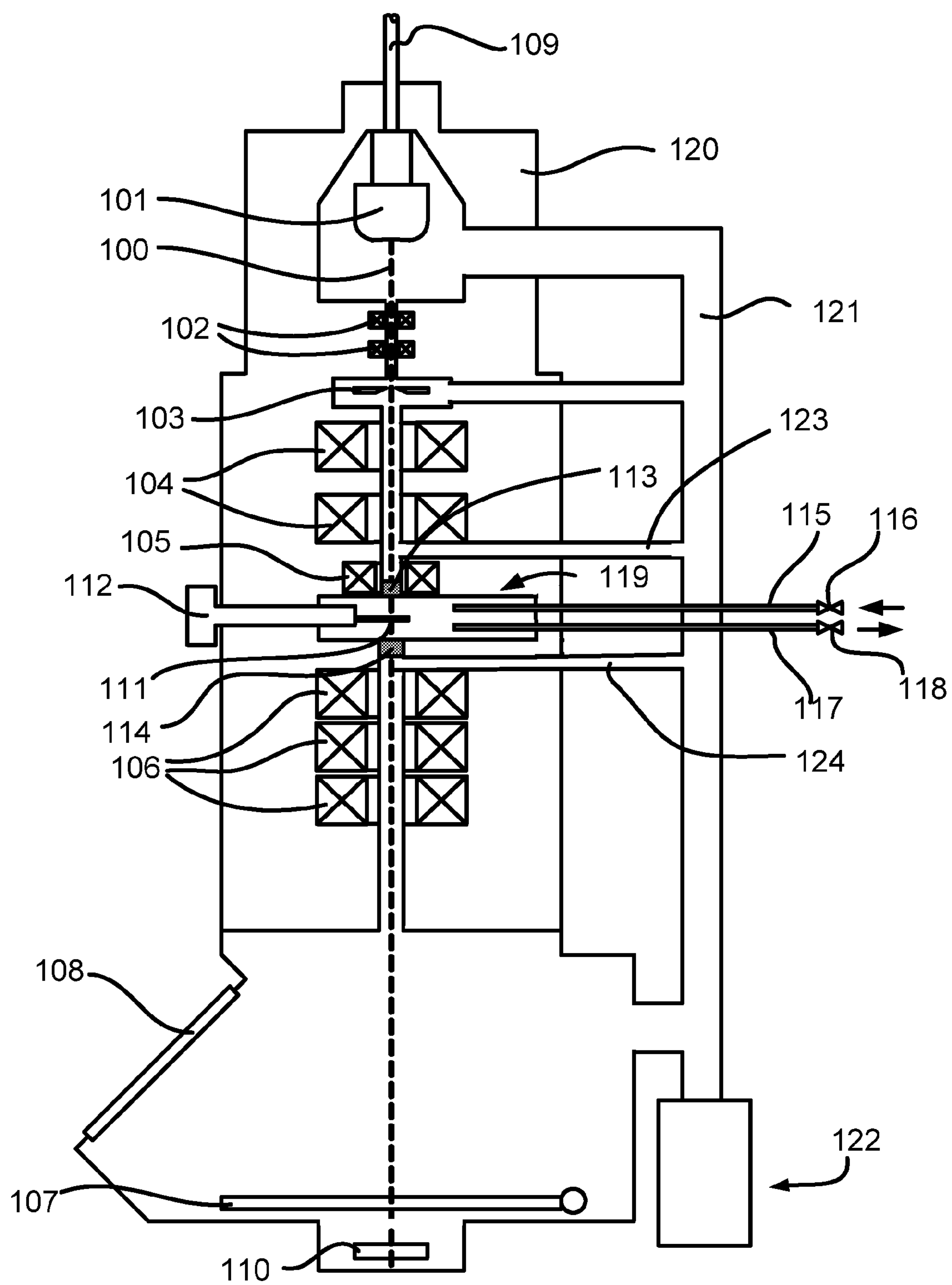
FIG. 1 schematically shows an (E)TEM according to the invention.

The ETEM comprises a housing 120 that is evacuated via vacuum tubing 121 by vacuum pumps 122. A high voltage cable 109 connects the electron source 101 with high voltage electronics (not shown). The electron source generates a beam of electrons along axis 100. Alignment coils 102 align the beam of electrons, aperture 103 limits the beam and condenser lenses 104 form an image of the electron source. Objective lens 105 then forms a parallel beam of electrons on the sample position 111.

It is noted that the sample may be illuminated with a focused beam that is rastered over the sample. This is named Scanning Transmission Electron Microscopy.

The sample (not shown) is positioned on the sample position 111 by side-entry sample holder 112. Lenses 106 then form an enlarged image of the sample on a fluorescent screen 107 that can be observed via window 108. The screen 107 is often retractable or folding, and can thus be removed from the optical axis. The electrons can then impinge on, for example, a direct electron detector 110 mounted under the folding screen.

Active gas is fed to the sample chamber 119 via tube 115. A controlled leak valve 116 controls the amount of gas entering the sample chamber. Tube 117 removes gas from the sample chamber, the valve 118 in combination with the gas inlet via valve 116 regulates the gas pressure in the sample chamber. Not shown is a second gas inlet for supplying the inert gas, with its associated leak valve.

It is noted that the valves in the inlet and outlet tubes may be controlled in a feedback loop, the signal for the feedback given by, for example, a pressure measuring device (not shown) or a residual gas analyzer (not shown).

Gas restrictions 113 and 114 restrict the amount of gas entering the rest of the microscope, and thus enable elevated pressures in the sample chamber while keeping the vacuum in, for example, the gun area at a high-vacuum level. The gas restrictions take the form of an aperture in a diaphragm, or they may take the form of a foil impervious to gas, but transparent to electrons. Differential pumping via tubes 123 and 124 ensure that the electron source and projection chamber remain at high vacuum. First differential stage of pumping often occurs via holes in the objective pole pieces. It is noted that often more pump restrictions are used, and that the pumping need not be done by central vacuum pump 122, but that the differential pumping may be done by a dedicated vacuum pump.

The images on detector 110, a direct electron detector such as a CCD or more preferably a CMOS detector, or another type of detector comprising, for example, a fluorescent screen in combination with optical fibers and a CCD camera, can take images in less than 100 ms, for example 50 ms. Lower acquisition times (exposure times) can be used, but both data transfer and signal-to-noise become a problem. Resolution of the images is, for advanced, commercially available ETEMs, down to 50 pm ($1/20$ nm). Under forementioned conditions (acquisition time $1/20$ s, resolution $1/20$ nm) the effective resolution in the image is limited by drift if the drift is more than, for example, 1 nm/s. For some experiments acquisition times in excess of one second are used, and a drift of, for example, 1 nm/s would then limit the image resolution to, for example, 1 nm.

ETEMs with more than one gas inlet are known. For example the commercially available Titan ETEM, manufactured by FEI, Hillsboro, USA, is equipped with four gas inlets.

It is further noted that pumping restrictions 113, 114, tubing 123, 124 and gas inlet 115 and gas outlet 117 with their associated valves 116, 118 are typical properties of a ETEM, but that the rest of the instrument resembles, or equals, a standard (non-environmental) TEM.

It is also noted that the ETEM can be equipped with many types of detectors, as well as correctors for, for example, correction of spherical and chromatic aberrations, and/or energy filters.

Instead of the leak valves shown, mass flow controllers, (automated) leak valves, or any other kind of valve capable of regulating the gas flow can be used. Also, instead of two or more gas inlets, one gas inlet with a gas mixing unit can be used.

Figure 2:
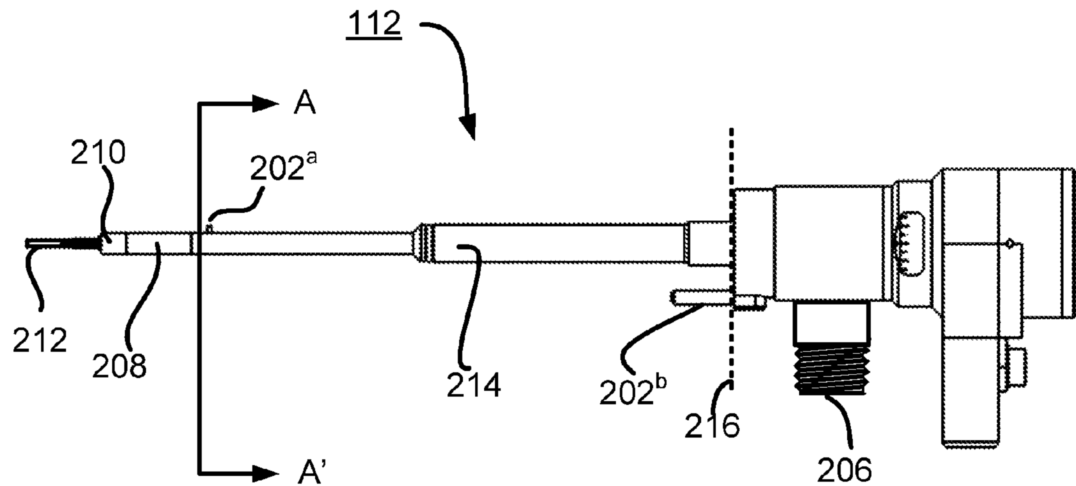
FIG. 2 schematically shows a side-entry heating holder for an (E)TEM.

FIG. 2 schematically shows a side-entry heating holder for an (E)TEM. Mechanically the part of the heating holder 200 to the right of AA' resembles a standard holder. The exact dimensions, including the position and dimension of pins like pins $202^a$ and $202^b$, used for positioning and interlocking with the (E)TEM, and the diameter of rod 214, are dependent on the (E)TEM in which the heating holder is to be used. To the right of AA' the sample holder resembles a standard TEM holder, with the exception of electrical connection 206. To the left of AA' the holder shows a thermal isolator 208, a base 210 and a tip 212. Reference plane 216 is the plane with which the holder rests against the (E)TEM.

Tip 212 can be heated via a heater and has a recess to hold a sample carrier, for example a standard 3 mm grid. Herewith a sample, mounted on the sample carrier, can be placed on the holder and positioned on the optical axis of the (E)TEM.

It is noted that, as the holder rests against the (E)TEM at reference plane 216, the length of the rod, the thermal insulator, the base and the tip should not be affected by the temperature of the tip, as this would result in drift.

The heater is, for example, a furnace or resistive wire heater to bring the tip to a high temperature. A thermocouple may be included to register the temperature. The four wires necessary for the heater and the thermocouple are connected to a vacuum tight feed-through integrated in base 210. A thermal insulator 208, for example a thin-walled ceramic tube, is welded to the base 210 and rod 214. Both the insulator 208 and rod 214 are hollow, so that the electrical connections can be fed to electric connector 206. Preferably the rod is made of a thermally conductive material with a low thermal expansion rate. Together with the low thermal conductivity of the thermal insulator 208 (due to the material used and the thin wall of the tube), most of the temperature gradient occurs over the thermal insulator. The temperature gradient and the thermal expansion over the rod 214 are low, even at elevated temperatures of the tip and base. Also, as the thermal conductivity via thermal insulator 208 is low, a relatively small power is sufficient to heat the tip. In this way commercially available holders reach a tip temperature of over 1000° C.

At high temperatures the thermal loading of different parts is due to thermal conductivity through the material and radiation resulting from e.g. infrared reflection in the sample chamber. In vacuum there is no conductivity through gas. However, at elevated pressures of, for example 1 mbar or higher, the gas affects the thermal gradient over the holder, having a cooling effect on the tip and a heating effect on the rod. As a result the temperature at the tip is likely to change, and the expansion from tip to the reference plane will change.

It is noted that, although great efforts are taken to make the thermal conductivity via the ceramic tube, and to keep the expansion coefficient of the combination of rod, ceramic tube and base as small as possible, an expansion of, for example, one micrometer or more cannot be avoided when changing from high vacuum to a gas pressure of about 1 mbar. Nowadays a commercially available (E)TEM can have a resolution of less than 100 pm at high vacuum, and less than 150 pm at a pressure of 15 mbar. An expansion of one micrometer is thus many orders of magnitude more than the resolution, and it is then even difficult to keep the same features in the field of view of successive images.

Figure 3:
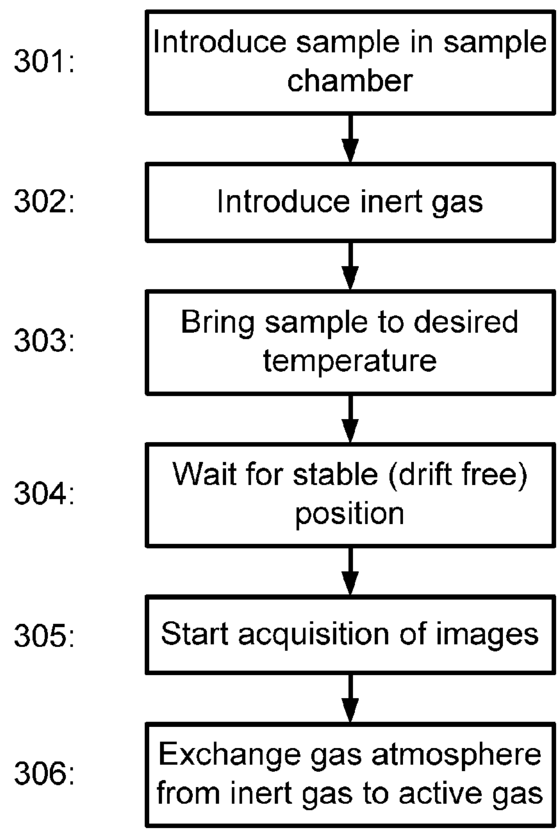
FIG. 3 schematically shows a flowchart for studying a sample.

FIG. 3 schematically shows a flowchart for studying a sample.

In step 301 the sample is introduced in the sample chamber. This may be as mounted on the side-entry holder 112, but it may also be introduced by a load-lock mechanism in which a tip comprising the sample is introduced in the instrument and coupled to a manipulator, the manipulator heatable. A TEM comprising such a load-lock (although non-heatable) is described in European Patent Application EP09 174 548.

In step 302 an inert gas is introduced in the sample chamber. Such an inert gas is typically from the group of noble gasses or nitrogen, but may comprise or consist of any gas that shows no, or a negligible, reaction with the sample. It is noted that the sample chamber may already be filled with the inert gas before step 301. Steps 301 and 302 are thus interchangeable.

In step 303 the sample is brought to a desired temperature. This may be a temperature above ambient temperature, but may also be a temperature below ambient. Heating can be done with resistive heating, but alternatively heating with a laser may be used. Also other types of heating, for example RF heating, may be used. Cooling can be achieved by connecting the tip with a cold source such as liquid nitrogen, as described in U.S. Pat. No. 7,420,184, or the sample holder may be equipped with a small cooling unit as described in "Micromachined Joule-Thomson coolers for cooling low-temperature detectors and electronics", H. J. M. ter Brake et al., Proceedings of the 7th international conference on space optics, Oct. 14-17, 2008, or connected to a Peltier cooler.

In step 304 the sample is brought to a stable, drift free position.

It is noted that bringing the sample to a desired temperature in step 303 may be done before exposing the sample to the inert gas in step 302, but that thermal equilibrium must be reached while exposed to the inert gas.

In step 305 the acquisition of images starts. As the study often involves the observation of a process, it often involves a series of images, preferable one (the reference image) taken before exposing it to an active atmosphere, and one or more from the onset of the chemical reactions or physical change, that start when exposing the sample to the active atmosphere.

In step 306 the sample is exposed to the active atmosphere, and thus the chemical reaction or physical change starts. Often the study involves the acquisition of images for many minutes. The reaction may be a chemical reaction, as a result of the exposure of the sample to a chemically active gas. Of special interest are chemical reactions of a gas and a catalyst. The reaction may be a physical change, such as a phase change. Examples are the growth of a whisker from the gas phase growing on a solid, or changes in surface structure resulting from the exposure to gases.

It is noted that, although the invention is explained for a heated sample, another area of inspection is for example the inspection of biological samples at a temperature where amorphous ice is stable: at a temperature above 137° C. amorphous ice changes in another type of ice, and ice needles occur that change (damage) the sample. When ETEM experiments for such samples arise, for example for etching a frozen sample, similar problems occur as for heated samples. Here as well first exposing the (frozen) sample to an inert atmosphere, such as a noble gas or nitrogen. Also other ETEM experiments at temperature well below room temperature are envisaged.

It is further noted that, although the invention is described for electron microscopy only, the skilled person will recognize the changes necessary to use this invention in, for example, X-ray microscopy, light microscopy, or scanning probe microscopy (including scanning tunneling microscopy and associated microscopy). As such techniques even permit a higher pressure, the effect of the gas on the thermal equilibrium will even be more severe.

We claim as follows:

1. A method of imaging gas-solid interactions between an active gas and a sample supported by a side-entry sample holder in a sample chamber of an atomic resolution microscope, the method comprising:

mounting the sample onto the side-entry sample holder, the side-entry sample holder configured to control the temperature of the sample;

positioning the sample mounted on the side-entry sample holder inside the sample chamber;

establishing a desired temperature of the sample, wherein the desired temperature of the sample is different from a temperature of the sample chamber thus creating a temperature gradient along the side-entry sample holder, with the temperature gradient controlled by temperature, pressure and flow rate of a gas inside the sample chamber;

exposing the sample to an inert gas and establishing a first desired temperature gradient by controlling the temperature, the pressure and the flow rate of the inert gas;

replacing the inert gas with the active gas and exposing the sample to the active gas, wherein exposure to the active gas causes the sample to undergo the chemical reaction or physical change;

acquiring an image of the sample during the chemical reaction or physical change, wherein the temperature gradient along the side-entry sample holder when imaging the sample is close enough to the first temperature gradient established under inert gas conditions so that the drift of the sample over the acquisition time of the image is less than ten times the resolution of said image.

2. The method of claim 1, in which a reference image is acquired under the inert gas conditions before the active gas is introduced.

3. The method of claim 1 in which the desired temperature of the sample is above 100° C.

4. The method of claim 3 in which the desired temperature of the sample is above 500° C.

5. The method of claim 4 in which the desired temperature of the sample is above 1000° C.

6. The method of claim 1, in which the desired temperature of the sample is below −20° C.

7. The method of claim 6, in which the desired temperature of the sample is below −137° C.

8. The method of claim 1, in which the drift of the sample over the acquisition time of the image is less than twice the resolution of said image.

9. The method of claim 8, in which the drift of the sample over the acquisition time of the image is less than the resolution of said image.

10. The method of claim 1, in which controlling the temperature, the pressure, and the flow rate of the inert gas is such that the drift of the sample with respect to the field of view is less than 1 nm/s.

11. The method of claim 10, in which the drift of the sample with respect to the field of view is less than 0.2 nm/s.

12. The method of claim 11, in which the drift of the sample with respect to the field of view is less than 0.1 nm/s.

13. The method of claim 1 in which the atomic resolution microscope is an environmental transmission electron microscope (ETEM) or an environmental scanning transmission electron microscope (ESEM).

* * * * *